United States Patent [19]

Sato

[11] Patent Number: 4,651,308
[45] Date of Patent: Mar. 17, 1987

[54] LSI MEMORY CIRCUIT

[75] Inventor: Kazuyuki Sato, Tokyo, Japan

[73] Assignee: Kabushiki Kaisha Toshiba, Kawasaki, Japan

[21] Appl. No.: 673,392

[22] Filed: Nov. 21, 1984

[30] Foreign Application Priority Data

Nov. 25, 1983 [JP] Japan .................................. 58-220712

[51] Int. Cl.⁴ .............................................. G11C 8/00
[52] U.S. Cl. .................................... 365/230; 365/189
[58] Field of Search ........................ 365/189, 230, 233

[56] References Cited

PUBLICATIONS

Toshiba MOS Memory Products Data Book, p. 255, 1983–1984.

Primary Examiner—Joseph A. Popek
Attorney, Agent, or Firm—Cushman, Darby & Cushman

[57] ABSTRACT

In a LSI memory having a memory cell matrix, an address buffer for receiving address data, row decoder and column decoder for decoding address data, and output buffer for receiving the column decoder output, there is provided a driver, connected to the column-decoder output, which drives the output as a horizontal read address; and a driver, connected to the column decoder output, which drives the output as vertical read address. Any one of the drivers can be selected according to a desired read direction. The output of the selected driver is supplied to a selector. The selector receives data read out from the memory cell matrix and outputs horizontal read data or vertical read data using the driver output as address data.

2 Claims, 8 Drawing Figures

F I G. 5A
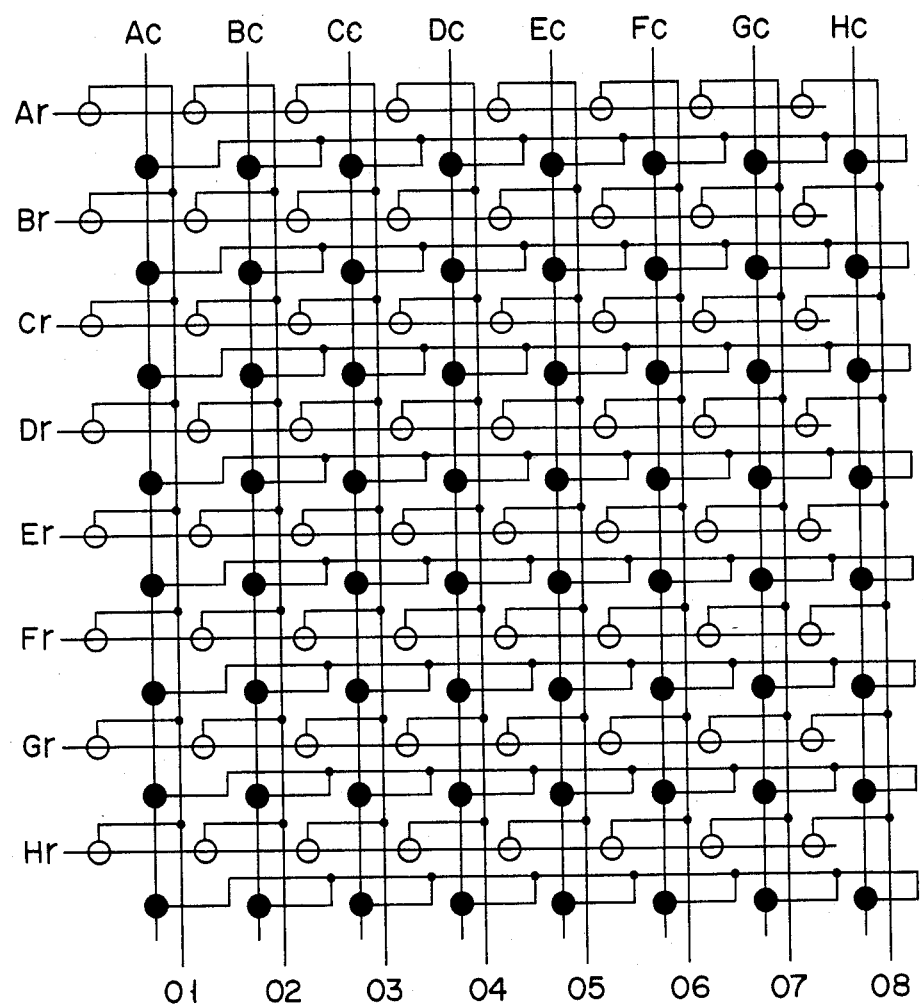

| 0 | 0 | 0 | 0 | 0 | 0 | 0 | 1 |
|---|---|---|---|---|---|---|---|
| 1 | 1 | 1 | 1 | 1 | 1 | 1 | 1 |
| 1 | 0 | 0 | 0 | 0 | 0 | 0 | 0 |
| 1 | 0 | 1 | 1 | 1 | 1 | 1 | 1 |
| 0 | 0 | 0 | 0 | 0 | 0 | 0 | 0 |
| 0 | 0 | 1 | 1 | 1 | 1 | 1 | 1 |
| 0 | 0 | 1 | 0 | 0 | 0 | 0 | 0 |
| 0 | 0 | 1 | 1 | 1 | 1 | 1 | 1 |

LSI MEMORY CIRCUIT

BACKGROUND OF THE INVENTION

The present invention relates to an LSI memory circuit.

Generally, a mask ROM is mostly used as a kanji pattern memory. The mask ROM is generally constructed as shown in FIG. 2. In response to a clock signal from a chip enable input buffer and clock circuit 1, an address buffer 3 receives address information. The upper and lower bits of the address information are supplied to a row decoder 5 and a column decoder 7, respectively. The row decoder 5 supplies its output to a memory cell matrix 7. The memory cell matrix 7 produces a corresponding row data to the column decoder 9. The column decoder 9 supplies column data corresponding to the address to an output buffer 11, thereby performing read operation of data.

A device using kanji patterns such as a CRT display unit and a printer is provided with two types of kanji patterns due to different scanning directions. FIGS. 1A and 1B show examples of such patterns. Kanji patterns corresponding to two types of scanning directions are stored in the mask ROM. In the examples, FIGS. 1A and 1B show the patterns corresponding to a row scan (horizontal read) and a column scan (vertical read), respectively. Therefore, a kanji data processing system should be provided with mask ROMs for two types of patterns or an external circuit for performing horizontal and vertical conversion.

However, the printer essentially uses two types of patterns since there are two types of printing forms, vertical and horizontal. On the other hand, having mask ROMS for the two types of patterns is costly, and the vertical-horizontal conversion remarkably reduces its performance.

SUMMARY OF THE INVENTION

It is an object of the present invention to provide a low cost and high performance LSI memory cirucit which enables the vertical and horizontal read operations using a single type of mask ROM.

To achieve the above object, there is provided an LSI memory circuit, comprising:
 a memory cell matrix;
 an address buffer for receiving externally supplied address data;
 a row decoder for decoding the address data from said address buffer to select a row data of said memory cell matrix;
 a column decoder for decoding the address data from said address buffer to select a column data of said memory cell matrix;
 driver means for producing the output from said column decoder as a vertical read address or a horizontal read address;
 selector circuit means connected to the outputs of said memory cell matrix and driver means for producing a vertically read-out data or horizontally read-out data in response to the output from said driver means; and
 output buffer means for receiving the output from said selector circuit means;

According to the present invention, the number of mask ROMs, which in the prior art were required for the vertical and horizontal read, can be reduced. Furthermore, the vertical-horizontal converting circuit can be eliminated thereby simplifying the hardware. In prior art, time for editing the patterns has been wasted corresponding to the number of bits when the vertical-horizontal conversion is performed. In the present invention, desired pattern data can be obtained simultaneously in both of vertical and horizontal read thereby permitting a high speed operation.

BRIEF DESCRIPTION OF THE DRAWINGS

Other objects and features of the present invention will be apparent from the following description taken in connection with the a,ccompanying drawings in which:

FIG. 5A is a circuit showing a depicted block of the memory selecting circuit shown in FIG. 4;

DETAILED DESCRIPTION OF THE PREFERRED EMBODIMENTS

Figure 3:
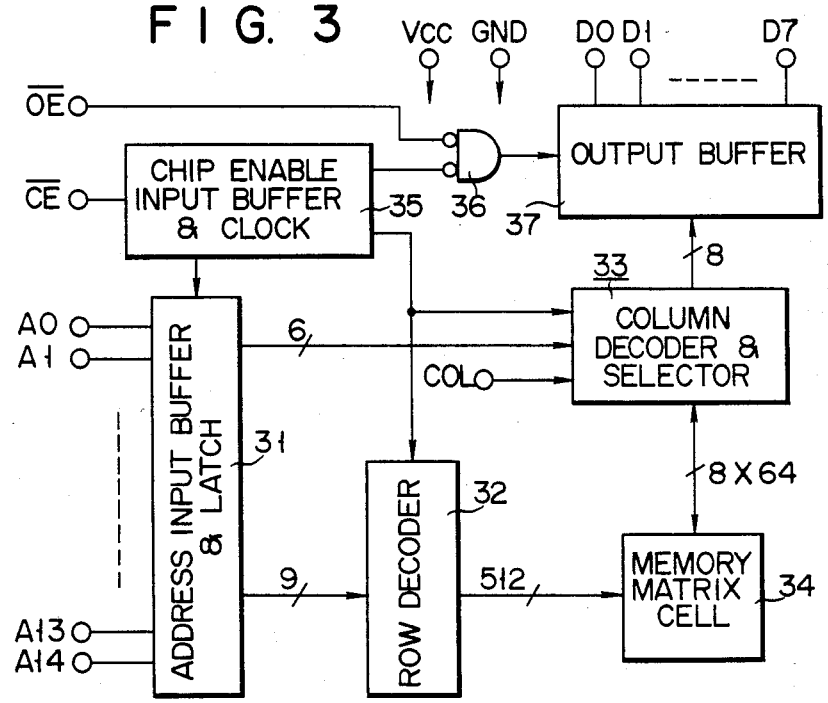
FIG. 3 is a block diagram showing an embodiment of an LSI memory circuit of the invention.

FIG. 3 is a block diagram showing an embodiment of the present invention. An address buffer 31 receives an address (A0 through A14) supplied from, for example, a CRT display unit or a printer, and supplies its output to a row decoder 32, a column decoder and selector circuit 33. In an embodiment of the invention, the column decoder 33 is provided with a selector for selecting a vertical scan or a horizontal scan. A one-bit control signal is supplied to the selector through a control pin COL which serves as a terminal of a mask ROM. The control signal enables either an address driver (331 in FIG. 4) for the vertical scan or an address driver (332 in FIG. 4) for the horizontal scan. A memory cell matrix 34 comprises a mask ROM of 31,728 words×8 bits (262,144 bits in total). A chip-enable input buffer and clock circuit 35 distributes a chip-enable signal supplied through a CE terminal to the address buffer 31, row decoder 32, and column decoder and selector 33. A chip-enable signal from the chip enable input buffer and selector 33 is supplied through a negative-input AND gate 36 to an output buffer 37 together with an output enable signal supplied through a terminal OE. The output buffer 37 drives an eight-bit data from the column decoder and selector 33 to be fed as pattern data through the D terminal (D0 through D7) to a device using a memory such as the CRT display unit or the printer. In the figure, $V_{cc}$, GND and COL designate a power source terminal, ground and column read mode terminal, respectively.

Figure 4:
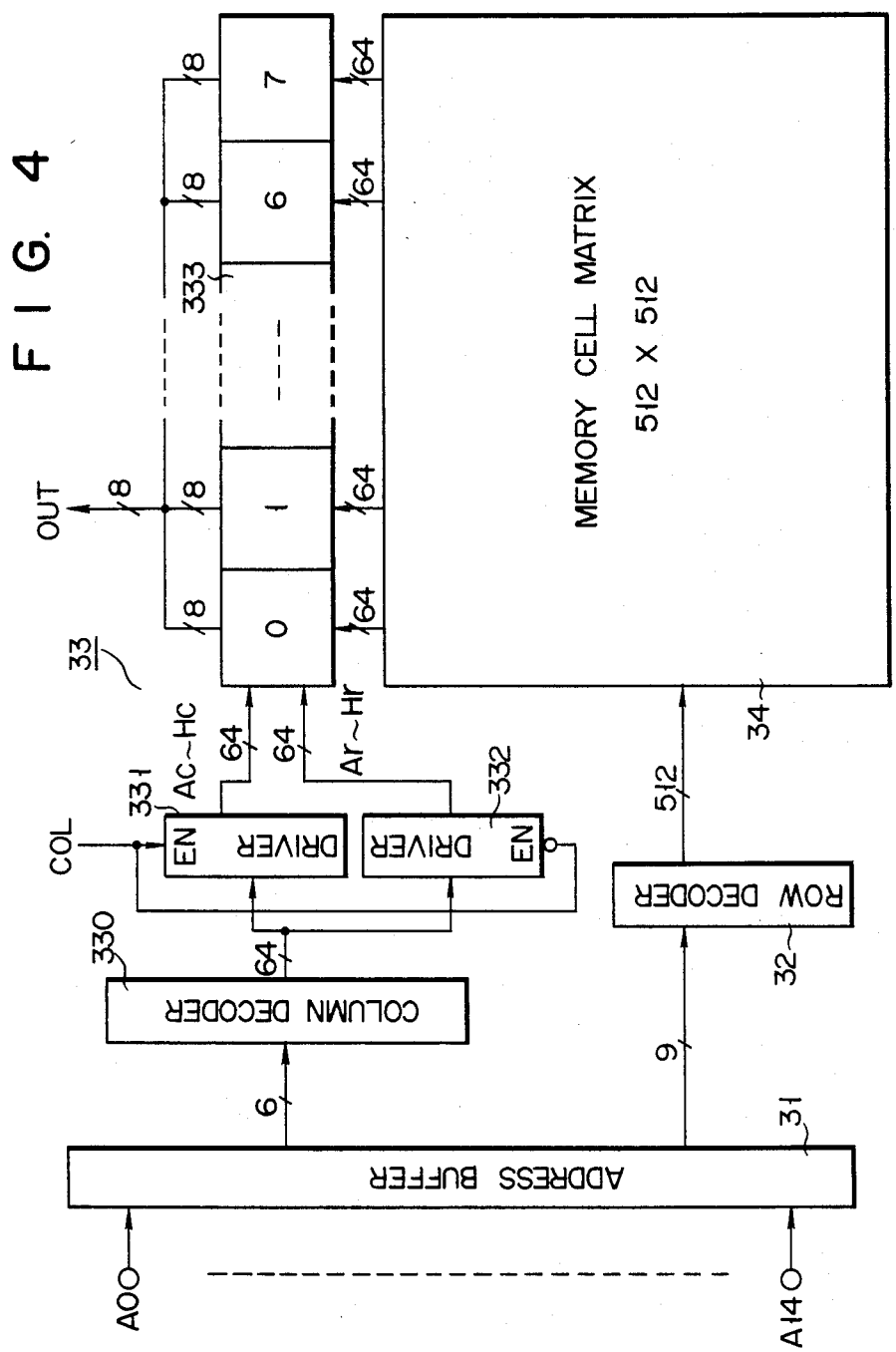
FIG. 4 is a detailed block diagram of the periphery of a column decoder and selector.

FIG. 4 is a detailed block diagram showing peripheral circuitry of column decoder and selector 33 in FIG. 3. Like numerals are used for like parts in FIG. 3. A column scan address driver 331 drives the output of a column decoder 330 as an address for the vertical read. A row scan address driver 332 drives the output of a column decoder 330 as an address for the horizontal address.

A one-bit control signal is supplied through the COL terminal to the enable terminal EN of the driver 331 and the inverted one-bit control signal is supplied through the COL terminal to the enable terminal EN of the driver 332. With the control signal, any one of the drivers can be selected, and its output can be supplied to a memory selector 333. In this embodiment, the memory selector 333 comprises either selecting blocks.

Among the 64 bits supplied from the driver 331 or driver 332, the first eight bits are supplied to block 0, the second eight bits are supplied to block 1, and the outputs of the column decoder are supplied to the respective block in an eight-bit unit.

One of the selecting blocks (block 0) is shown in detail in FIG. 5A. In the figure, the white dot represents a transfer gate for row scanning, the black dot represents a transfer gate for column scanning, Ar through Hr represent a row-scan, address line, Ac through Hc represent a column scan-address line, and O1 through O8 represent an output line.

Figures 5B, 6:
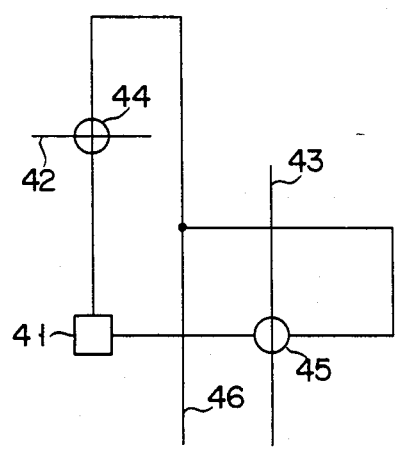
FIG. 5B shows an upper-left bit pattern data of a kanji pattern.
FIG. 6 shows a construction of a one-bit memory cell.

FIG. 6 shows a construction of a one-bit memory cell. As shown in the figure, the output bit data from the memory cell by the row decoder is output onto an output line 46 through a transfer gate for horizontal read and a transfer gate for vertical read. Futhermore, the transfer gates 44 and 45 are connected to a horizontal-read address driver line and a vertical-read address driver line. Any of the gates 44 and 45 enabled by the address driver lines passes the bit data on to the output line.

Figure 1A:
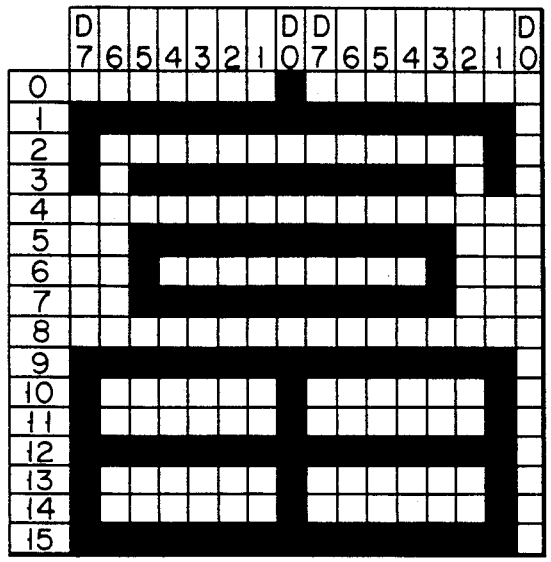
FIGS. 1A and 1B show examples of kanji patterns stored in the mask ROMs.
Figure 1B:
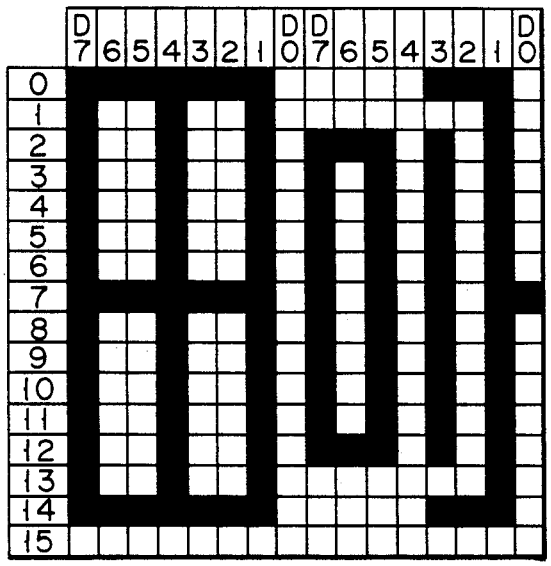
Figure 2:
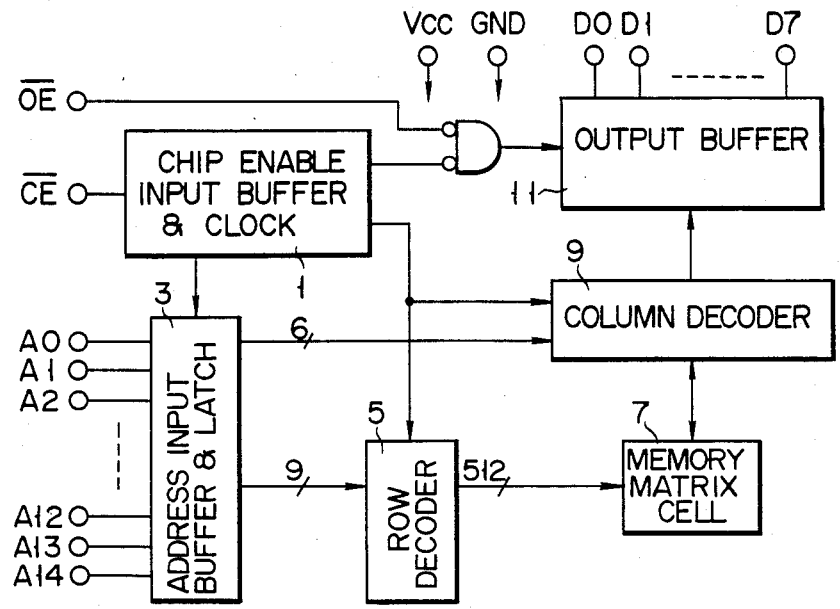
FIG. 2 is a block diagram showing an internal arrangement of a prior-art LSI memory circuit.

FIG. 5B shows the format of upper-left pattern data of the kanji pattern in FIG. 1A.

Now an operation of the emodiment will be described in detail. First, an address data is input from the outside to the address input buffer and latch circuit 31 through the address input terminals A0 through A14. The address data is supplied through the address buffer 31 to the row decoder 32 and the column decoder 330. If the control signal supplied from the CPU (not shown) through COL terminal is "true," the column scan address driver 331 drives the output of the column decoder 330. Simultaneously, the output of the scan address driver 332 becomes "0," thereby turning off all the row scan transfer gates (white dots) which constitute the selector 333.

Alternately, if the control signal supplied through the COL terminal is "false," the output of the column scan address driver 331 becomes "0," thereby turning off all the column transfer gates (black dots) of the memory matrix cell 34. Simultaneously, the row scan address driver 332 drives the output of the column decoder 330.

Assume that six bit data of "000000" are supplied from the address buffer 31 to the column decoder 331 and that a "true" signal is supplied to the driver 331 from the COL terminal. Then, the driver 331 is selected, and 64-bit data of "0 . . . 0" is supplied to the selector 333. As a result, the 64-bit data of "0 . . . 0" is supplied to the column lines Ac through Hc of the selecting block 0 thereby enabling the column line Ac. As a result, left column data in FIG. 5B is output as "00001110" onto the output lines O1 through O8.

On the other hand, if a "false" signal is supplied from the COL terminal, the driver 332 is selected. Then, the row lines Ar through Hr of the selecting block 0 are supplied with the 64-bit data "0 . . . 0" thereby enabling the row line Ar. As a result, the uppermost data shown in FIG. 5B is output as "00000001" onto the output lines O1 through O8.

What is claimed is
1. An LSI memory circuit, comprising:
a memory cell matrix;
an address buffer for receiving address data supplied externally;
a row decoder for decoding address data output from said address buffer and for selecting row data of said memory matrix cell;
a column decoder for decoding address data output from said address buffer corresponding to data stored in said memory cell matrix;
driver means for selectively outputting the decoded address data output from said column decoder as horizontal read address or vertical read address data;
selector means connected to the outputs of said memory cell matrix and driver means for obtaining horizontal read data or vertical read data from said memory cell in accordance with the selected output of said driver means; and
output buffer means for receiving the output from said selector means.
2. An LSI memory circuit according to claim 1, wherein said driver means comprises a first driver connected to said column decoder for outputting the column decoder output as the horizontal read address and a second driver connected to said column decoder for outputting the column decoder output as the vertical read address, and a "true" signal supplied to one driver and a "false" signal supplied to the other driver thereby selecting the driver corresponding to a desired read direction.

* * * * *